(12) United States Patent
Wilheim

(10) Patent No.: US 6,921,451 B2
(45) Date of Patent: Jul. 26, 2005

(54) METHOD OF AND APPARATUS FOR PROTECTING THIN COPPER FOIL AND OTHER SHINY SUBSTRATES DURING HANDLING AND RIGOROUS PROCESSING, AS PCB MANUFACTURE AND THE LIKE, BY ELECTRIC-CHARGE ADHERENCE THERETO OF THIN RELEASE-LAYERED PLASTIC FILMS AND THE LIKE, AND IMPROVED PRODUCTS PRODUCED THEREBY

(75) Inventor: Martin J. Wilheim, New York, NY (US)

(73) Assignee: Metallized Products, Inc., Winchester, PA (US)

( * ) Notice: Subject to any disclaimer, the term of this patent is extended or adjusted under 35 U.S.C. 154(b) by 0 days.

(21) Appl. No.: 10/186,866

(22) Filed: Jun. 28, 2002

(65) Prior Publication Data
US 2004/0001958 A1 Jan. 1, 2004

(51) Int. Cl.[7] .............................................. B32B 31/12
(52) U.S. Cl. .................... 156/247; 156/259; 156/273.1; 156/289

(58) Field of Search .......................... 156/230, 47, 233, 156/242, 256, 289, 250, 344, 272.2, 247; 427/96, 146, 147, 209, 289; 428/195, 204, 203, 209

(56) References Cited

U.S. PATENT DOCUMENTS

| | | | | |
|---|---|---|---|---|
| 3,755,043 A | * | 8/1973 | Igarashi et al. | 307/400 |
| 4,465,538 A | * | 8/1984 | Schmoock | 156/233 |
| 4,569,879 A | * | 2/1986 | Groves | 428/198 |
| 4,818,576 A | * | 4/1989 | Pennace et al. | 428/40.9 |
| 5,057,372 A | * | 10/1991 | Imfeld et al. | 428/412 |
| 5,120,590 A | * | 6/1992 | Savage et al. | 428/76 |
| 5,948,526 A | * | 9/1999 | Wilheim et al. | 428/352 |
| 6,280,851 B1 | * | 8/2001 | Pasternack et al. | 428/447 |

* cited by examiner

Primary Examiner—Melvin Mayes
(74) Attorney, Agent, or Firm—Rines and Rines

(57) ABSTRACT

An improved method of and apparatus for producing preferably thin plastic protective film layers for thin shiny copper foils and the like, as for PCB applications, with electric-charge adhering of the same to the foil and with peel-off releasable properties to provide the same original pristine, shiny copper foil surface without contamination, marring or other physical, chemical or other residue despite handling and other processing procedures.

14 Claims, 2 Drawing Sheets

Figure 1:
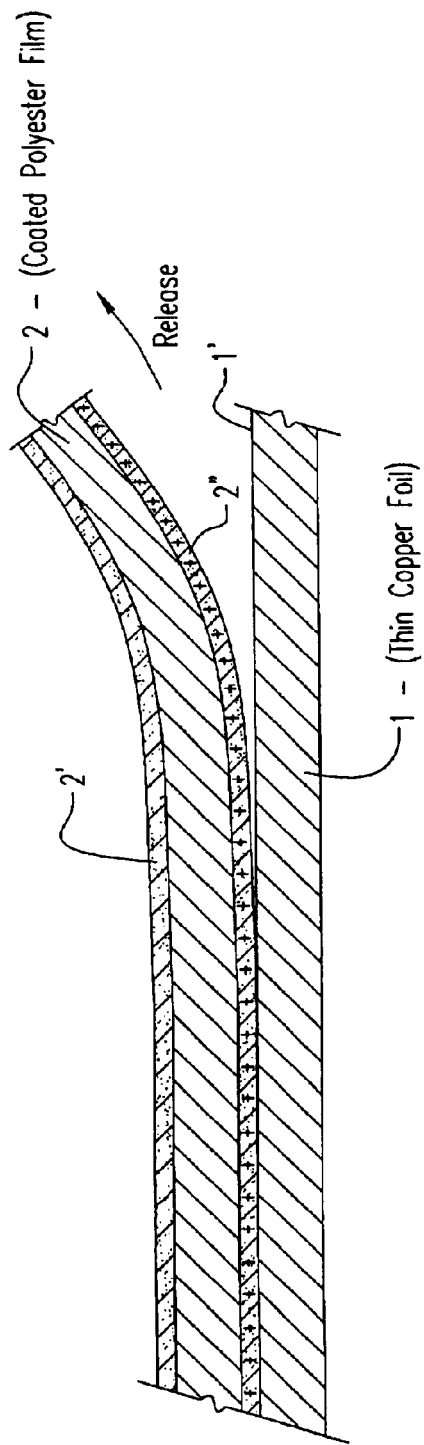

METHOD OF AND APPARATUS FOR PROTECTING THIN COPPER FOIL AND OTHER SHINY SUBSTRATES DURING HANDLING AND RIGOROUS PROCESSING, AS PCB MANUFACTURE AND THE LIKE, BY ELECTRIC-CHARGE ADHERENCE THERETO OF THIN RELEASE-LAYERED PLASTIC FILMS AND THE LIKE, AND IMPROVED PRODUCTS PRODUCED THEREBY

FIELD

The invention relates to releasable insulative layers for protecting contaminatable and damageable thin, clean and shiny ("drum-side") substrate surfaces, particularly, though not exclusively, thin copper and related foil surfaces and the like, as required in printed circuit board (PCB) and related technologies, among others.

BACKGROUND

In the printed circuit board (PCB) industry, it is necessary that the thin soft and pliable smooth and shiny clean copper foil be protected as by an adhered but releasable masking film or layer, from the depositing of airborne particulates and from marring; and that it also be buffered from imperfect separator plates and the like. The foil, furthermore, is preferably somewhat stiffened and somewhat cushioned to withstand transit, slitting, sheeting and tooling processes, and specifically, the handling during the PCB processing. The adhered protective layer or film, moreover, for certain processing purposes, must withstand high temperatures up to 400° F. and endure up to 700 psi of high laminating pressure, but then still be readily strippable from the copper foil to enable etching and photolithographic and other PCB surface processing. All this, moreover, with a critical film release from the copper foil that leaves absolutely no residue on the pristine shiny smooth foil and no marking or pattern embossing effect on the foil surface.

Heretofore, approaches to solve the above problem have involved the use of preferably polyester and other plastic layers, adhesively attached to the foil as in our prior U.S. Pat. No. 4,753,847, marketed under the trademark PACO-THANE. Adhesives, however, always raise the problems of cost, curing time, surface uniformity and residues, among others. Other approaches to the adherence of protective layers to copper foils or the like, however, are also described in our later U.S. Pat. Nos. 5,948,526 and 5,989,377. The Sentrex Company has offered a product under the mark COPPERGARD using a 3-mil low-density polypropylene with 1.25-mil linear low-density polypropylene attached on both sides of the copper foil, and has obtained U.S. Pat. No. 6,280,851. A further U.S. Pat. No. 5,120,590 of Gould Inc. has also proposed protective layers for an electrodeposited metal foil; and a Mitsui Mining U.S. Pat. No. 5,942,314 discloses ultrasonically weld-bonding of aluminum to the copper. The REServices Company in its product SC, spot-adheres stainless steel to the copper.

The present invention was stimulated by questioning and exploring whether suitable protective layers could be releasably attached to the copper foil without resorting to the use of conventional physical adhering techniques—adhesives, bonding, etc.—but using instead the temporary adhesion of permanent electrical charges. While charge-adhesion had been long used for other purposes including more recently primarily in the graphic arts industry as for providing compositor printing sheets comprising a backing and a printing sheet including a plastic electret sheet subjected to electrostatic fields under high voltage corona arc discharge, as disclosed, for example, in the Permacharge Corporation U.S. Pat. No. 6,284,339 and also in U.S. Pat Nos. 5,989,685 and 5,904,985, such, however, involve very different products, problems, requirements and processing than those of the printed circuit board field and of thin metal foils and the like, so that the electrical charge adhesion concept did not at first seem applicable to the radically different products, needs and conditions of PCB manufacture. Questions arose, for example, as to whether an electric-charge adherence could be strong enough; how long can the charge last; what does humidity do to the charge; would the charge deleteriously affect the protective layer release performance; would the charge impact the copper foil in the laminating process; and would the charge hold during the rigorous handling and processing conditions of PCB operations; etc.? Our early attempts, indeed, to use the electric-charge process with its conventional corona or arc treatment as used in the graphic arts industry for its purposes, indeed, failed to meet the PCB requirements. Modification of the conventional electric-charge approach, including elimination of corona treatment and the use preferably of select polyester plastic protective layers and the like, improved charge adherence to, for example, 232 grams of force in one test, and ultimately led to the successful adaptation and use of this charge-adhesive technique for purposes of the present invention.

OBJECTS OF INVENTION

A primary object of the invention, accordingly, is to provide a new and improved method of and apparatus for adapting electric-charge adherence techniques for plastic and related copper-foil-protecting layers, (including those formed as by electron-beam and other curing techniques and by high pressure laminating procedures), to PCB smooth and shiny thin copper foils and the like, and with inherent capability of readily strippable or peel-off release of the charge-adhered layer(s) without residual contamination or other marring of the copper foil surface(s) as earlier described.

Another object is to provide such a novel method and apparatus that are also useful to protect other kinds of smooth shiny surfaces as well.

A further object is to provide a novel electrically charged plastic protective layer ready for adhering to PCB and other copper foil surfaces and the like and particularly adapted to be wound and unrolled for use in such purposes.

Still a further object is to provide novel protected foil assemblies and the like having protective electrically charge-adhered layers that are readily releasable.

Other and further objects will also be described hereinafter and will be more particularly delineated in the appended claims.

SUMMARY

In summary, from one of its viewpoints, particularly in the application to thin copper foil and the like, the invention embraces a method of protecting a smooth high finish shiny thin conducting copper foil as for PCB use, that comprises, electrostatically permanently charging a protective masking insulating plastic film pre-treated with a release surface; laminating the film to the foil to charge-adhere the film release surface against the foil; and subsequently, after the protection is no longer required, stripping the film from the foil.

Preferred and best mode embodiments are later detailed, and including application to a variety of smooth shiny substrate surfaces apart from PCB copper foil.

DRAWINGS

Figure 2:
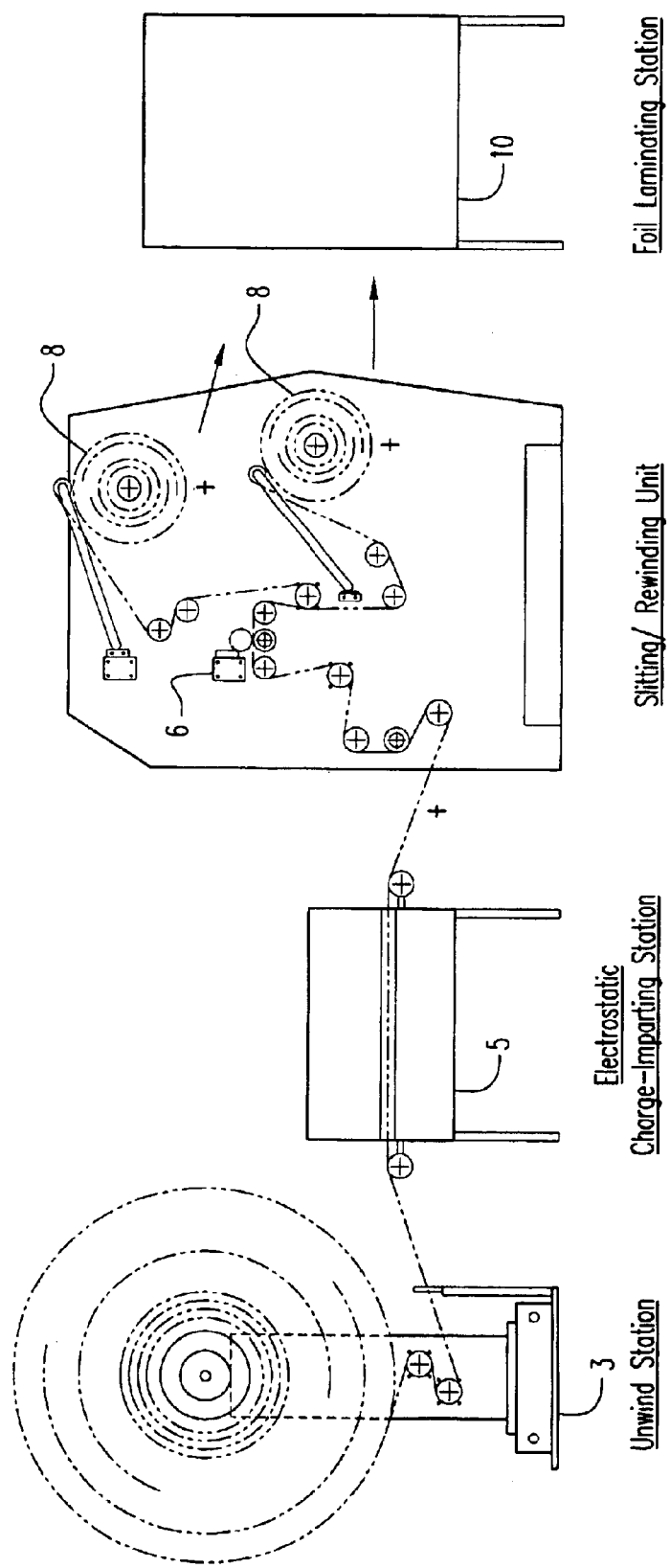

The invention will now be explained in connection with the accompanying drawings, illustrative of the exemplary application of the invention to copper foil and the like, and in which FIG. 1 is a sectional view of a preferred copper foil-protected product of the invention; and FIG. 2 is a schematic side elevation of an apparatus and technique for creating the permanently charged protective plastic film layers or sheets for products as in FIG. 2, and in web roll form.

PREFERRED EMBODIMENTS OF THE INVENTION

Referring to FIG. 1, a preferred illustrative product made in accordance with the method and apparatus of the invention, is shown in longitudinal cross-section, comprising a thin high gloss smooth copper foil or sheet 1, useful for the before-described PCB and related fields, say of the order of from 0.00019" to 0.0005" in thickness, provided with a thin upper plastic protective composite film 2 adhered to its upper surface. The film is illustrated as of the previously described polyester plastic film laminate type 2 having thin cured preferably acrylated oligomer resin release coatings 2' and 2" adhered on the upper and lower surfaces, as described in our previously referenced U.S. Pat. No. 4,753,847, and using the chemical compositions and electron-beam or other curing and laminating processing described therein and in the other cited later referenced patents. With this two-sided release-coated laminate, the film 2 may, for example, be a 0.00092 inch PET film, with the overall release coated structure 2-2'-2" having a thinness of about 0.0016 inch. As another example, a 0.00048 inch PET film with such two-sided release coatings may have a final thinness of about 0.0012 inch. A suitable range of such film thickness is from 0.00048 inch to 0.003 inch.

While applying chemistry pre-treatment for smooth cured release coating surfaces as for the coating surface 2" adjacent the corresponding smooth shiny copper foil surface 1', the outer or upper coating surface 2' may, in some instances, be formed with a somewhat rougher surface for handling advantages in the sheeting processing of the film-protected foil; more specifically, wherein one cut sheet may slide more easily over the next upon such rougher surface.

In practice, the insulating protective film laminate 2-2'-2" is provided in rolls as at the unwind station 3 in FIG. 2, for unwinding and feeding to and through a web electrostatic charge-imparting station 5 to permanently positively charge the film to act as an electret (indicated by the plus signs +) as, for example, in the manner taught in U.S. Pat. Nos. 6,143,255 and/or 5,686,050. The required release charged protective film is then conveyed through one or more slitters 6, with the resulting slit sheets thereof conveyed to a corresponding plurality of rewinding rollers 8 to provide charged film rolls for respective well-known copper foil-laminating stations 10 to produce the protected foil.

Thus, in the laminated protected foil product of FIG. 1, the lower surface 2" of the protective film laminate is shown electric-charge adhered (+), uniformly to the upper surface 1' of the thin copper foil 1, in accordance with the before-described technique of the invention. The smooth foil surface 2" prevents the undesirable effect of embossing of a pattern on the copper foil surface.

Tests have shown, as earlier alluded to, that such charge-adhesion of these preferred polyester plastic films to thin copper foil, unlike with prior customary corona-arc charging procedures used for the graphic art type of very different products, proved more successful in some tests without the use of any corona treatment and also then without at all disturbing the release properties of the film. Release or peel-off forces or strength of less than about 25 grams per lineal inch are attainable. The stripping or release of the protective film from the copper foil surface 1' is schematically shown to the right in FIG. 1.

The invention enables providing permanently charged insulative thin protective plastic film rolls to the PCB and copper clad laminate for lamination-charge-adherence to the copper foil sheets. The PCB copper clad laminate manufacturers use the protected copper in their lay-up of laminating components. The components are pressed under the before-mentioned temperatures/pressures/time to provide a so-called "C-staged" or cured laminate, say, for example, in 36"×48" sizes or larger, that are then cut into, for example, usable 18"×24" laminates for the PCB shop—all protected by the charge-adhered film of the invention. For the chemistry of the polyester preferred release coated pre-treated films previously described, moreover, (and other plastic types as well, as later described), the protective composite layer shown 2-2'-2" is made substantially or nearly transparent, so that undesirable defects on the protected copper can be readily seen—a great advantage of the preferred products of the invention.

When the printed circuit board shop is ready to use the laminates, they strip or peel off the protective film and then proceed to drill, electroplate, image, etch and print, etc. and upon the same pristine, clean, smooth, unmarred and residue-free surface of the original copper foil that existed before the application of its protective layer (s). After printing and etching, the PCB shop generally produces a multi-layered laminate involving the etched panel with applied impregnated glass resin applied to two sides of the etched inner layer and copper and after that on both sides.

In other processes, the copper foil may be used in narrower rolls or sheets supplied by the copper foil manufacturer with the charge-adhered protective masking film applied to ensure the cleanliness of the copper surface(s) (½ or 1 ounce copper, for example). Before such employment in this lay-up or lamination process, moreover, all components may be punched or drilled with registration-keeping holes. Then, multilayered multiples of these components, separated by stainless steel plates, are inserted in a press and laminated at high temperature and pressure and over several hours of time for curing, as earlier described. The charge-adhered protective film layers are then stripped from the copper for further processing steps. Such are described, for example, in the earlier referenced U.S. Pat. No. 5,120,590.

The remarkable insight and discovery underlying the invention is that under appropriate conditions, as before described, suitable charge-adhered protective thin films can serve to protect, even somewhat stiffen, and cushion, thin copper foils through all of the above-described handling and vigorous processing procedures and still protect the smooth, clean, unmarred shiny copper surface without mark or other physical or chemical residue whatsoever—and still retain the required range of release or peel-off properties.

While preferred plastic polyester thin film compositions have been stressed as best mode embodiments, other plastic films and even appropriately treated paper are also usable with varying degrees of usefulness; among them, polypropylene—particularly bi-axially oriented polypropylene—, polyvinylidine fluoride, polyeihylene, TPX polymethyl pentene) and co-extruded films with releasable surface properties, and silicone treated films. For the purposes of the present invention, however, though thin films are preferable, including charged films of the order of about 0.00048"/0.0031" mil and the like, they must not wrinkle or curl or partially detach after application to the foil. Other shiny clean subsfrate surfaces besides thin copper foil, moreover, may also benefit from the charge-adhered protective or masking film techniques of the invention, including stainless steel, chrome, glass, acrylics, Lucite, plexiglass and high finish furniture and related surfaces as well.

Further modifications will also suggest themselves to those skilled in this art, such being considered also to fall within the spirit and scope of this invention, as defined in the appended claims.

What is claimed is:

1. A method of protecting a smooth high finish shiny thin conducting copper foil as for PCB and copper clad laminate use, that comprises, electrostatically permanently charging a protective masking insulating plastic film laminate pre-treated on each of opposite surfaces with a release surface; laminating the charged film to the foil to charge-adhere one of the film laminate release surfaces against the foil; and subsequently, after the protection is no longer required, stripping the film from the foil.

2. The method as claimed in claim 1 wherein the plastic film is provided in rolls and unwound and fed through a web-charging station, and then rewound as charged-film rolls available for and prior to laminating to roll-fed foil.

3. The method of claim 2 wherein the film after charging is slit prior to the rewinding and prior to the laminating to the foil.

4. The method of claim 2 wherein the film is substantially transparent.

5. The method of claim 2 wherein the film is selected from the group consisting of polyester, polypropylene, biaxially oriented polypropylene, polyvinylidine fluoride polyethylene, paper and silicone TPX (polymethylpentene) and co-extruded films with releasable surface properties treated films.

6. The method of claim 1 wherein the film is a polyester plastic laminate having a coating of a thin release layer of a cured release acrylated/epoxy/urethane oligomer and/or oligomer blended resin on at least one surface of the film.

7. The method of claim 6 wherein said coating is applied to both sides of the film.

8. The method of claim 6 wherein the laminate film surface that is charge-adhered to the foil is smooth and the other surface is relatively rougher.

9. The method of claim 1 wherein the film release peel strength is less than about 25 grams per lineal inch.

10. The method of claim 1 wherein the charge-adhered film remains releasable after exposure to process temperatures of up to about 400° F. and pressures of up to about 700 pounds per square inch for periods of time up to several hours.

11. A method of protecting a smooth high finish shiny uncharged surface substrate, that comprises, electrostatically permanently charging a protective masking insulating plastic or paper laminate film pre-treated on each of opposite surfaces with a release surface; applying the film upon the shiny substrate surface to charge-adhere one of the film laminate release treated surfaces against said shiny substrate surface; and subsequently, after the protection is no longer required, stripping the film from the uncharged substrate surface.

12. The method of claim 11 wherein the substrate surface is selected from the group consisting of copper, stainless steel, chrome, glass, acrylics, Lucite, plexiglass and high finish furniture surfaces.

13. A method of protecting a smooth high finish shiny thin conducting copper foil as for PCB and copper clad laminate use, that comprises, electrostatically permanently charging a protective masking insulating plastic film pre-treated on at least one surface with a release surface; laminating the charged film to the foil to charge adhere the film release surface against the foil; and subsequently, after the protection is no longer required, stripping the film from the foil.

14. The method of claim 13 wherein the film is a polyester plastic laminate having a coating of a thin release layer of a cured release acrylated/epoxy/urethane oligomer and/or oligomer blended resin on at least one surface of the film.

* * * * *